(12) United States Patent
Guthrie (10) Patent No.: US 6,348,838 B1
(45) Date of Patent: Feb. 19, 2002

(54) OPTIMAL POWER COMBINING FOR BALANCED ERROR CORRECTION AMPLIFIER

(75) Inventor: Warren Guthrie, West Olive, MI (US)

(73) Assignee: Netcom, Inc., Wheeling, IL (US)

( * ) Notice: Subject to any disclaimer, the term of this patent is extended or adjusted under 35 U.S.C. 154(b) by 0 days.

(21) Appl. No.: 09/715,587

(22) Filed: Nov. 17, 2000

Related U.S. Application Data

(63) Continuation-in-part of application No. 09/557,904, filed on Apr. 21, 2000.
(60) Provisional application No. 60/199,058, filed on Apr. 22, 2000, and provisional application No. 60/131,484, filed on Apr. 29, 1999.

(51) Int. Cl.[7] .............................. H03F 1/26; H03F 1/00
(52) U.S. Cl. ....................................... 330/149; 330/151
(58) Field of Search .................................. 330/149, 151

(56) References Cited

U.S. PATENT DOCUMENTS

| | | |
|---|---|---|
| 3,906,401 A | 9/1975 | Seidel |
| 4,379,994 A | 4/1983 | Bauman |
| 4,583,049 A | 4/1986 | Powell |
| 4,591,800 A | 5/1986 | Opas |
| 4,595,882 A | 6/1986 | Silagi et al. |
| 4,629,996 A | 12/1986 | Watanabe et al. |
| 4,879,519 A | 11/1989 | Myer |
| 4,926,136 A | 5/1990 | Olver |
| 5,077,532 A | 12/1991 | Obermann et al. |
| 5,157,345 A | 10/1992 | Kenington et al. |
| 5,304,945 A | 4/1994 | Myer |
| 5,376,899 A | 12/1994 | Pass |
| 5,444,418 A | 8/1995 | Mitzlaff |
| 5,485,120 A | 1/1996 | Anvari |
| 5,570,063 A | 10/1996 | Eisenberg |
| 5,594,385 A | 1/1997 | Anvari |
| 5,619,168 A | 4/1997 | Myer |

(List continued on next page.)

FOREIGN PATENT DOCUMENTS

EP          1 030 441 A2       8/2000

*Primary Examiner*—Robert Pascal
*Assistant Examiner*—Patricia T. Nguyen
(74) *Attorney, Agent, or Firm*—Michael Best & Friedrich LLP (57) ABSTRACT

An error correction amplifier and method of canceling distortion in an amplified signal. The error correction amplifier includes a main amplifier operable to receive a main input signal and generate an amplified signal having a main component and an error component. The error correction amplifier also includes a second amplifier coupled in a feed-forward arrangement to the main amplifier and operable to receive an input signal and to generate an output signal having a main component and an error component. A balancing network is coupled to the main amplifier and to the second amplifier. The balancing network isolates a sample of the output signal of the main amplifier, inverts the sample, and combines the sample with the input signal to the second amplifier. A summing point combines the output signal from the main amplifier and the output signal of the second amplifier in an unequal manner such that the error components of the two output signals substantially cancel one another and the main components of the output signals are added to one another. The method involves dividing an input signal into a first component and a second component; amplifying the first component of the input signal to create an output signal; sampling the output signal to create a sampled signal; combining the sampled signal and the second component of the input signal to create a combined signal; amplifying the combined signal to create a correction signal; and combining the output signal and the correction signal in an unequal combiner to create an amplified signal.

18 Claims, 4 Drawing Sheets

U.S. PATENT DOCUMENTS

| | | |
|---|---|---|
| 5,623,227 A | 4/1997 | Everline et al. |
| 5,675,288 A | 10/1997 | Peyrotte et al. |
| 5,757,231 A | 5/1998 | Tozawa |
| 5,760,646 A | 6/1998 | Belcher et al. |
| 5,838,195 A | 11/1998 | Szmurlo et al. |
| 5,867,064 A | 2/1999 | Van Horn et al. |
| 5,874,856 A | 2/1999 | Van Horn |
| 5,912,586 A | 6/1999 | Mitzlaff |
| 5,917,375 A | 6/1999 | Lisco et al. |
| 5,963,091 A | 10/1999 | Chen et al. |
| 5,977,825 A | 11/1999 | Mueck |
| 5,977,826 A | 11/1999 | Behan et al. |

OPTIMAL POWER COMBINING FOR BALANCED ERROR CORRECTION AMPLIFIER

RELATED APPLICATIONS

This application claims the benefit of prior filed co-pending provisional patent application No. 60/199,058 filed on Apr. 22, 2000. This application is a continuation-in-part of co-pending non-provisional application No. 09/557,904 filed Apr. 21, 2000. Non-provisional application No. 09/557,904 claims the benefit of provisional application No. 60/131,484 filed on Apr. 29, 1999.

BACKGROUND OF THE INVENTION

The present invention relates to distortion or error canceling amplifiers. More particularly, the invention relates to a distortion-canceling amplifier that implements unequal power combining of signals.

As is known, spectral regrowth refers to the amplification of signals outside a desired frequency range. Ideally, an amplifier would amplify signals without creating noise, particularly noise outside the frequency range of the input signal. In practice, this ideal has not yet been achieved, and spectral regrowth often causes interference between adjacent communication channels. Limiting or reducing spectral regrowth is an important factor to improving spectral efficiency. When spectral regrowth is low, interference is reduced. With reduced interference, channel separation may be narrowed and the number of channels in a given bandwidth may be increased.

Feed-forward amplifiers ("FFAs") use two amplifiers: a main amplifier and a distortion-canceling amplifier. The main amplifier is operated at a relatively high power level and generates an amplified, but distorted or noisy signal. A feed-forward circuit or path is used to estimate the distortion generated by the main amplifier. The estimated distortion is inverted, amplified, and then summed with the output from the main amplifier to remove the distortion in the amplified signal.

A balanced error correction ("BEC") amplifier also uses two amplifiers. In a BEC amplifier, the output power from a main amplifier and an error-canceling amplifier are combined in an equal-power combiner. This results in about a fifty-percent efficiency improvement over feed-forward amplifiers. Nevertheless, the performance of BEC amplifiers is less than ideal.

The equal-power combining technique used in a BEC amplifier has at least two efficiency limitations. First, the output coupler or combiner dissipates desired signal power due to the fact that the input signals applied to the combiner can never be exactly equal. The dissipation reduces efficiency. Second, the error-canceling amplifier is necessarily operated at a non-optimal point that requires relatively high levels of the distortion-canceling signal. This higher-than-optimal distortion canceling signal results in further distortion due to a non-linear transfer of the distortion-canceling signal. The error amplifier experiences a reduced canceling capability that can only be compensated by a reduction in the desired output signal power. This, in turn, reduces efficiency.

SUMMARY OF THE INVENTION

Accordingly, there is a need for an improved amplifier that eliminates the deficiencies in BEC amplifiers.

The invention provides an amplifier for communications and other applications in the form of an optimal power combining ("OPC") amplifier. The OPC amplifier includes a main amplifier operable to receive a main signal and to generate an amplified signal having a main component and an error component. The amplifier also includes an error amplifier coupled in a feed forward arrangement to the main amplifier. The second amplifier receives an input signal and generates an output signal having a main component and an error component. A balancing network is coupled to the main amplifier and to the second amplifier. The balancing network isolates a sample of the error component of the output signal of the main amplifier, inverts the sample and combines the sample with the input signal to the error amplifier. An output combiner combines the output signal from the main amplifier and the output signal of the error amplifier in an unequal fashion such that the error components of the two signals substantially cancel one another.

The design of the OPC amplifier reduces losses due to the improvement in efficiency caused by appropriately accounting for unequal signal powers in the input signals of the combiner. Further, the design permits the error-canceling amplifier to be operated in a more linear fashion.

As is apparent from the above, it is an advantage of the present invention to provide an amplifier with improved power efficiency. Other features and advantages of the present invention will become apparent by consideration of the detailed description and accompanying drawings.

DETAILED DESCRIPTION

Before one embodiment of the invention is explained in detail, it is to be understood that the invention is not limited in its application to the details of the construction and the arrangements of the components set forth in the following description or illustrated in the drawings. The invention is capable of other embodiments and of being practiced or being carried out in various ways. Also, it is to be understood that the phraseology and terminology used herein is for the purpose of description and should not be regarded as limiting. In particular, it should be understood that the present invention is not limited to applications in communications, but may be used in a wide variety of applications where amplifiers are needed.

Figure 1:
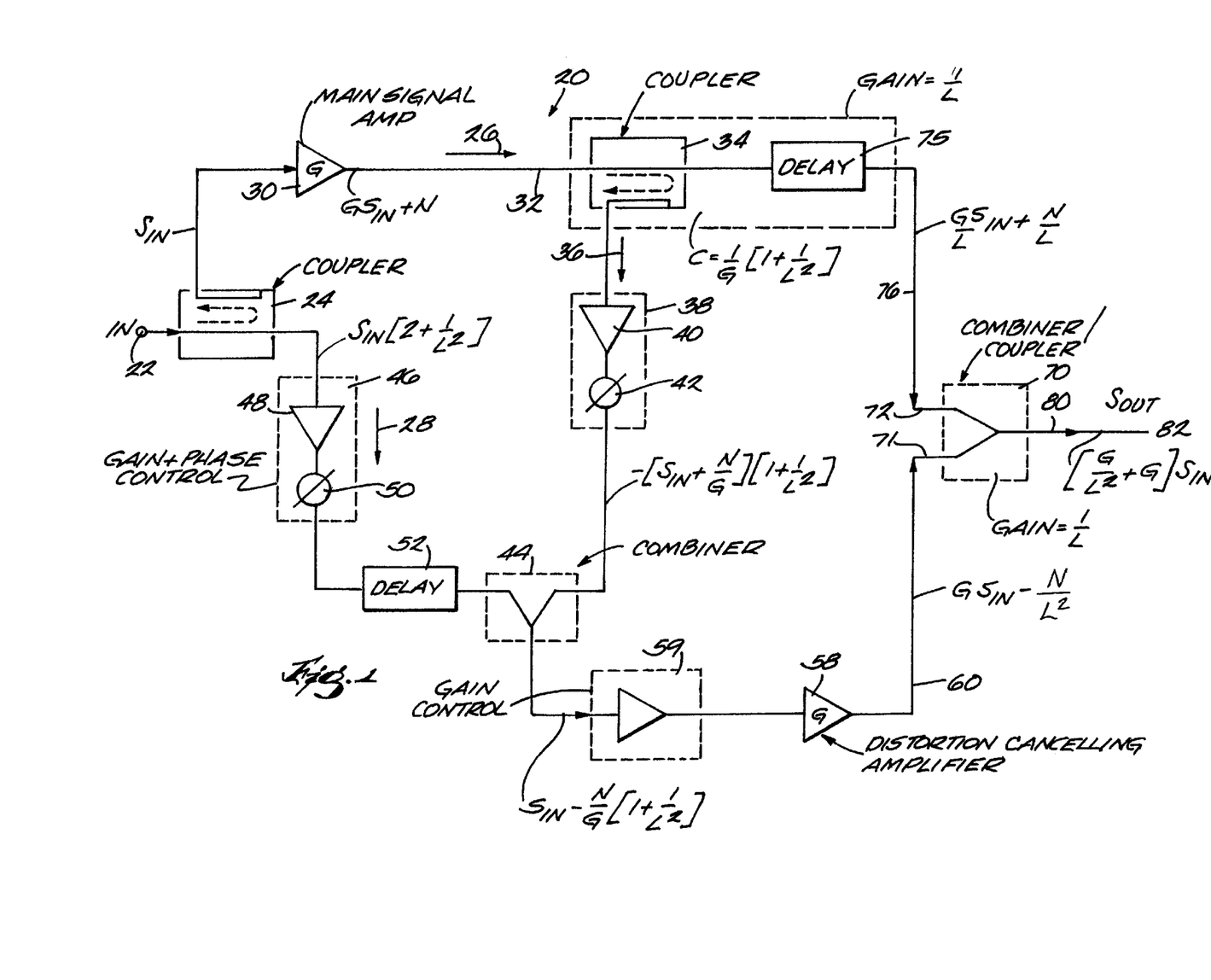
FIG. 1 is a circuit diagram of an optimal power combining ("OPC") amplifier embodying the invention.

FIG. 1 illustrates an OPC amplifier 20 embodying the invention. The OPC amplifier 20 receives an input signal IN at an input node 22. The input signal IN is split by a coupler 24 causing the input signal IN to be directed to a main path 26 and an error path 28. A signal $S_{IN}$ is directed to the main path 26 and is amplified by a main amplifier 30 having a gain G. The main amplifier 30 generates an amplified signal 32 having a main component ($GS_{IN}$) and an error or noise component (N). The amplified signal 32 is split by a coupler 34 that causes part of the amplified signal to be diverted down a feed-forward path 36 to a gain and phase control block or assembly 38. The coupler 34 has a coupling coefficient C of $$\frac{1}{G}\left[1+\frac{1}{L^2}\right].$$

The gain and phase control assembly 38 includes a gain control amplifier 40 having an adjustable gain. The gain and phase control assembly 38 also has a phase adjuster 42 that provides phase adjustment to compensate for variations in the components used in the OPC amplifier 20. Preferably, the gain and phase control assembly 38 is adjusted so as to produce an output signal of $$-\left(S_{IN}+\frac{N}{G}\right)\left(1+\frac{1}{L^2}\right).$$

This output signal is delivered to a combiner 44.

The signal from the coupler 24 that is directed to the error path 28 is gain and phase adjusted by a gain and phase control block or assembly 46. The gain and phase control assembly 46 has a gain control amplifier 48 having an adjustable gain. The gain and phase control assembly 46 also has a phase adjuster 50 that provides phase adjustment to the signal in the error path 28 to compensate for variations inherent in the components used in the OPC amplifier 20.

The output from the gain and phase control assembly 46 is delivered to a delay 52 that provides a time delay approximately equal to the amount of time required for a signal to propagate through the main amplifier 30. The output of the delay 52 is delivered to the combiner 44. The combiner 44 adds the signal from the gain and phase control assembly 38 to the output signal of the gain and phase assembly 46. The signal $$\left(S_{IN}-\frac{N}{G}\left[1+\frac{1}{L^2}\right]\right)$$

exiting the combiner 44 is input to an error or distortion canceling amplifier 58 having a gain G. Alternatively, the signal may be input to a gain adjustment amplifier 59, prior to being input to the distortion canceling amplifier 58. The distortion canceling amplifier 58 generates a signal 60 having a main component ($GS_{IN}$) and a noise component $$\left(-\frac{N}{L^2}\right).$$

The signal 60 is input into a summing point or combiner 70.

As noted above, the coupler 34 splits the amplified signal 32 such that part of the amplified signal 32 is diverted down the feed-forward path 36. Another part of the amplified signal 32 is directed to a delay 75. The delay 75 provides a time delay equal to the time required for a signal to propagate through the distortion-canceling amplifier 58. A signal 76 having a main component $$\left(\frac{G}{L}S_{IN}\right)$$

and an error or noise component $$\frac{N}{L}$$

exits the delay 75 and is directed to the combiner 70, which has a first input 71 and a second input 72.

The signal 60 and the signal 76 are delivered to the combiner 70 and are combined such that their error components substantially cancel each other and their main components are summed together. The resultant output signal 80 is output at an output node 82 and has more power than either the amplified signal 32 or the signal 60.

The advantages of the present invention over standard BEC amplifiers are based, in large part, on adjusting or choosing the gain through the coupler 34 and delay 75 and on the selection of the combiner 70 as an unequal power combiner. Preferably, the main and distortion canceling amplifiers have the same power capabilities.

The signal 32 from the main amplifier 30 propagates through the coupler 34 and delay 75. The signal 32 is reduced in amplitude by a loss through these components. Preferably, the coupler 34 and delay 75 have a gain of $$\frac{1}{L}$$

where L is representative of the loss from the second input 72 of the combiner 70 to the output node 82. As will be discussed in further detail below, the combiner 70 combines the signals 60 and 76 in a ratio that is equal to the ratio of the desired input powers. So, for example, if the signal 76 is lower than the signal 60 by 1.5SdB, the combiner 70 has 1.5 dB less coupling from the main or second input 72 than the error or first input 71.

Figure 2:
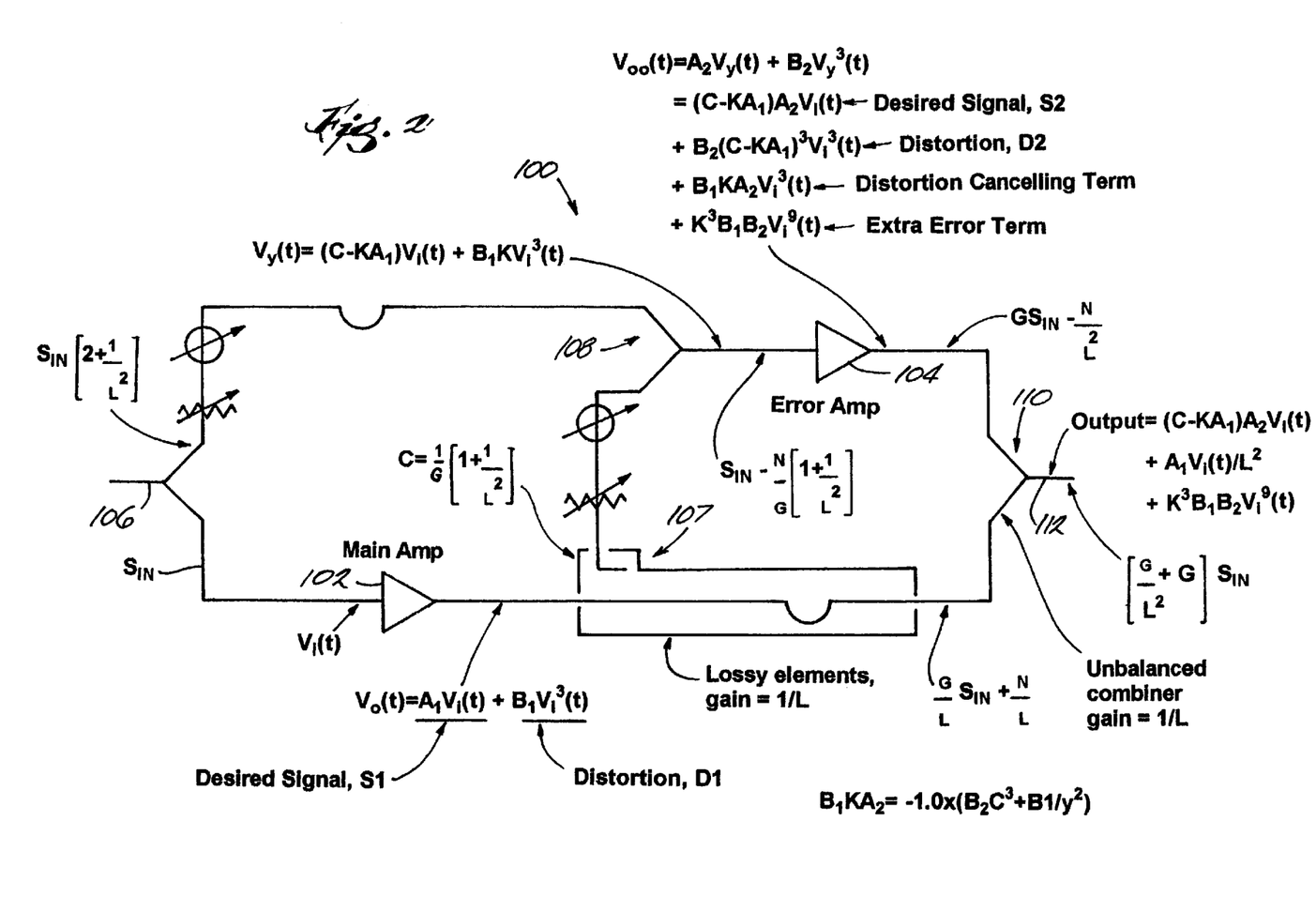
FIG. 2 is a circuit diagram of an OPC amplifier embodying the invention, illustrating the signal terms of signals propagated through the amplifier.
Figure 3:
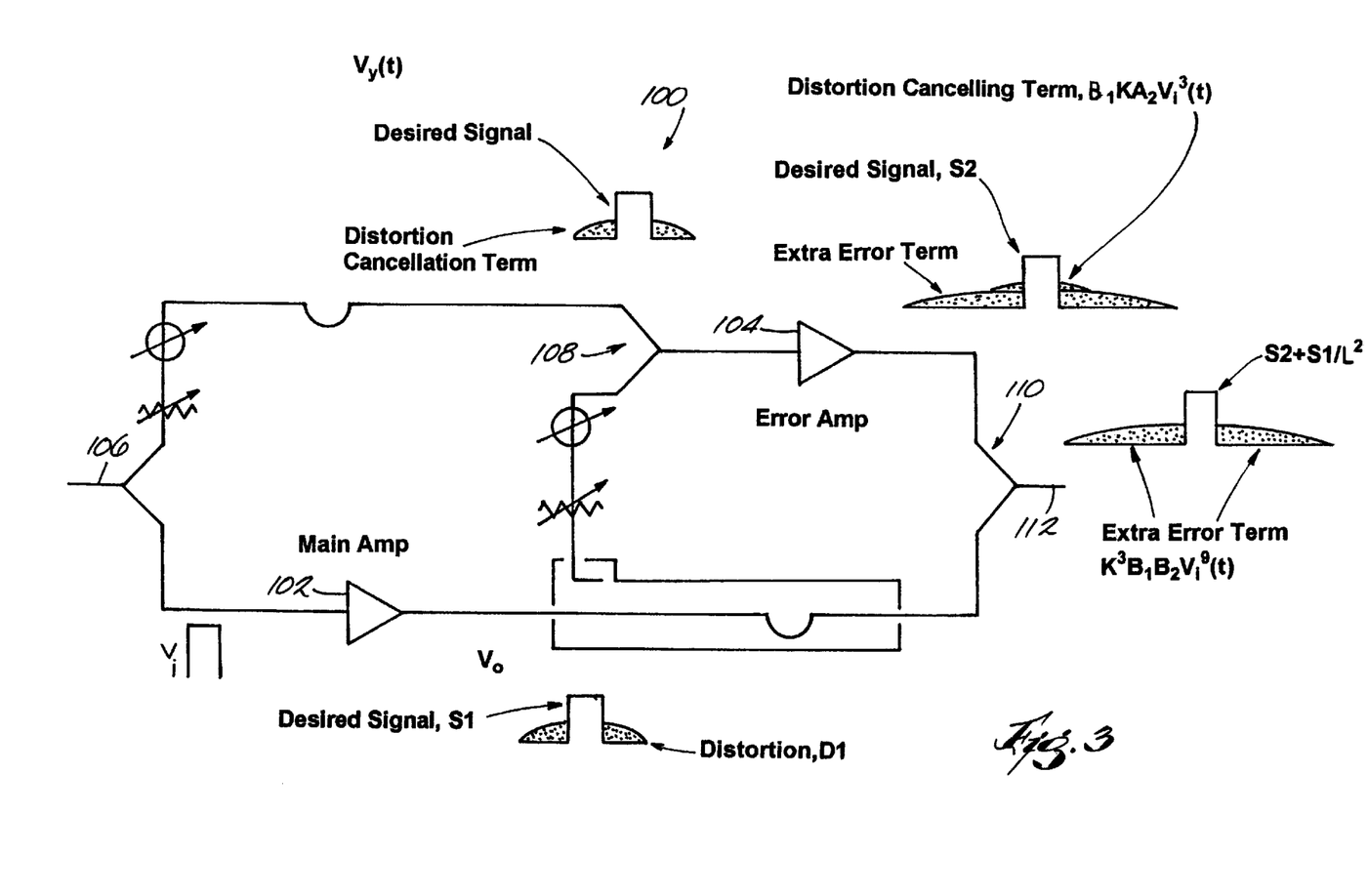
FIG. 3 is a circuit diagram of the OPC amplifier shown in FIG. 2, illustrating the spectral shapes of signals propagated through the amplifier.

The operation and advantages of the invention may be better understood by reference to FIGS. 2 and 3. FIG. 2 illustrates an amplifier 100 having a main amplifier 102 and an error amplifier 104. The amplifier 100 also includes an input node 106, a sampling coupler 107, a first combiner 108, an output combiner 110, and an output node 112. The amplifier 100 is configured in a manner similar to the amplifier 20 shown in FIG. 1. Accordingly, further discussion of the construction of amplifier 100 will not be provided herein. However, the operation of the amplifier 100 will be discussed.

Amplifier distortion of input signals is caused by non-linearities in the amplifier's characteristics. In many instances, it can safely be assumed that an amplifier produces only a first order term (the amplified or desired signal) and a third order term (a distortion term or component). For example, in the amplifier 100, the main amplifier 102 has a transfer function that amplifies the input signal $V_i(t)$ according to $V_o(t)=A_1V_i(t)+B_1V_i^3(t)$. The desired signal (S1) is $A_1V_i(t)$ and the distortion term (D1) is $B_1V_i^3(t)$. To perfectly eliminate the distortion component of the amplified signal produced by the main amplifier 102, the error amplifier 104 must generate a signal that exactly cancels the distortion amplifier. Just like any other amplifier, the error amplifier 104 produces its own third order distortion term. This distortion term plus the distortion term from the main amplifier are added at the output combiner 110. The input signal that is fed into the error amplifier 104 is adjusted so that the error amplifier provides a cancellation term to the combiner 110 at a certain level. In particular, the input signal to the error amplifier 104 is adjusted such that the output signal of the error amplifier 104 includes a component that is equal in amplitude, but 180 degrees out of phase from the combination of both the main and error amplifier distortion terms.

This is best understood by reference to the analysis below. The error amplifier 104 has a transfer function similar to the main amplifier 102: $V_{oo}(t)=A_2V_y(t)+B_2V_y^3(t)$. The signal input to the error amplifier 104 includes a sample of the output of the main amplifier and a signal $V_i(t)$ based on the signal to the input node 106. Explained in relation to the transfer function for the error amplifier 104, $V_y(t)$ consists of a distortion term $KB_1V_i^3(t)$ (which acts as a distortion-canceling signal) and a desired-input signal $(C-KA_1)V_i(t)$. C represents the coupling coefficient of the sampling coupler 107 and K represents the coupling coefficient of the first combiner 108 in the amplifier 100. When the signal $(C-KA_1)V_i(t)$ is applied to the error amplifier 104, two terms are produced:

1. $(C-KA_1)A_2V_i(t)$—this term is the desired signal, S2, and has an amplitude that is equal to the amplitude of the desired signal S1, or $A_1V_i(t)$.
2. $B_2(C-KA_1)^3V_i^3(t)$—this is the distortion term D2. The distortion term D2 is cancelled by the distortion-canceling term from the error amplifier 104.

When the signal $KB_1V_i^3(t)$ is applied to the error amplifier 104, two other terms are produced:

1. $KB_1A_2V_i^3(t)$—this term is used to cancel the distortion. It is set at an amplitude to cancel the third order terms from the error amplifier and the main amplifier 102. Since the amplitude of $KB_1A_2V_i^3(t)$ is proportional to K and $A_2$, the signal is a linear signal.
2. $K^3B_1B_2V_i^9(t)$—this term is referred to as an extra error term ("EET") and is caused by the error cancellation signal distorting in the error amplifier. The EET is proportional to $B_2$ and $K^3$. Thus, the EET increases by three dB for every one dB of cancellation signal increase.

Based on the above, it is apparent that increasing the amplitude of the cancellation signal input to the error amplifier 104 increases the EET, preventing the unwanted terms from being reduced to zero. Since unwanted terms cannot be completely eliminated, pure cancellation cannot occur. Nevertheless, improved efficiency results by constructing an amplifier according to the teachings provided herein.

The improvement in efficiency is best illustrated by comparing a typical BEC amplifier to an amplifier of the invention. In an amplifier of the invention, with an unequal combiner, there is no loss of the desired signal when the signals input to the output combiner 110 are combined with a ratio equal to the input power ratio and have correct phase. In a BEC amplifier, with an equal combiner, power losses increase as the power difference between the signals input to the output combiner increases. The power lost in an equal combiner is:

$$Lc=(P_{err} \times P_{main})^{1/2}-(P_{err}+P_{main})/2$$

where Lc is the power lost in the combiner, $P_{err}$ is the power provided to the combiner from the error amplifier, and $P_{main}$ is the power provided to the coupler from the main amplifier. For example, if $P_{err}=P_{main}$ then Lc=0. If $P_{err}$ or $P_{main}$ is zero then the loss is ½ of the remaining signal. In the equal-combiner case, the desired signal output power is:

$$P_{err}+P_{main}-Lc=3/2 \times (P_{err}+P_{main})-(P_{err} \times P_{main})^{1/2}$$

In an amplifier of the present invention, the desired signal output power is:

$$P_{err}+P_{main}$$

The ratio of equal combiner power to unequal combiner power is:

$$3/2-(P_{err} \times P_{main})^{1/2}/(P_{err}+P_{main})$$

For example, if there is 1.5 dB loss from the main amplifier 102 to the output combiner 110, the unequal combiner is 0.7% more efficient than a standard BEC amplifier.

Even better results may be achieved by operating the amplifier 100 with a relatively high amplitude cancellation signal. As was discussed above, the error amplifier 104 can only cancel a limited amount of distortion; the limit is a result of ninth order terms or EET that the error amplifier creates. The performance improvements that are possible by driving the error amplifier with a relatively high amplitude cancellation signal are evident from the discussion below.

The main amplifier 102 and the error amplifier 104 have equal desired signal levels and produce the same distortion power. That is, $\|S1\|=\|S2\|$ and $\|D1\|=\|D2\|$. However, the main distortion signal, D1, is reduced in amplitude to D1/L, where L is representative of the loss from main amplifier output to the combiner input. In the amplifier 100, the distortion $\|D1\|$ is reduced to $\|D1\|/L^2$ since the output combiner 110 provides a reduced coupling from the input of the combiner 110 to the output node 112. As noted, the reduced coupling in the combiner 110 is equal to the loss incurred from main amplifier to the combiner input. For example, if there is a 1.5 dB loss from the main amplifier 102 to the output combiner 110, then there is a 3 dB total loss to the distortion signal $\|D\|$ to the output node 112 of the amplifier 100.

The total distortion signal at the combiner 110 (prior to cancellation) is the sum of each distortion signal: $\|D1\|(1+1/L^2)$. In the 1.5 dB output-loss example, the total pre-cancellation distortion power is 1.5 times the distortion power at the output of the amplifier 102. In contrast, in an equal-power combiner BEC amplifier, the pre-cancellation power is set to $\|D1\|(1+1/L)$.

The distortion canceling capability of the error amplifier 104 approaches a limit imposed by the EET. The limit occurs when the EET power is at the distortion limit. The EET power is set by the distortion-canceling power applied to the input of the error amplifier 104. So, reducing the required distortion cancellation allows higher system output power. The system output power may be increased to the point where the requisite distortion-canceling signal returns to the previous level. Since $\|D1\|$ increases by a ratio of 3:1 relative to the desired signal, the net increase in desired power is ½ of the reduction in the required distortion cancellation. For the amplifier 100, the requisite pre-cancellation distortion power is $\|D1\|/(1+1/L^2)$. As noted, in the equal-combiner case the pre-cancellation distortion power is $\|D1\|(1+1/L)$. The ratio is of the two is:

$$(1+1/L)/(1+1/L^2)$$

Thus, in the 1.5 dB output loss example, the relative pre-distortion level is 1.14 or 0.6 dB.

Since the amplifier 100 exhibits an increased distortion canceling capability, additional power is available from the main and error amplifiers, as compared to a typical BEC amplifier. In the amplifier 100, the pre-cancellation distortion level increases 3:1 over the desired signal. As such, the distortion approaches the desired signal power at a rate of 2:1. Therefore, the unequal power combiner amplifier 100 has an increased desired signal power of:

$$½ \times (1+1/L)/(1+1/L^2)$$

In the 1.5 dB output loss example, the output power may be increased by 0.3 dB over the equal-combining method.

The increase in efficiency in the amplifier 100 is the product of the improvement from the two reduced losses in an unequal combiner and the ability to drive the error amplifier with a higher amplitude cancellation signal. In the example discussed herein, the total improvement is 7.8%.

FIG. 3 illustrates the spectral shapes of the signals propagated through the amplifier 100. As can be seen, the signal $V_y(t)$ includes a desired signal and a distortion cancellation term that falls outside of the desired spectrum. Once amplified by the error amplifier 104, the spectral regrowth expands due to the creation of the EET. At the output node 112, the output signal still exhibits spectral regrowth in the form of an EET of $K^3 B_1 B_2 V_1^9(t)$, but the amplitude of the EET is diminished.

Figure 4:
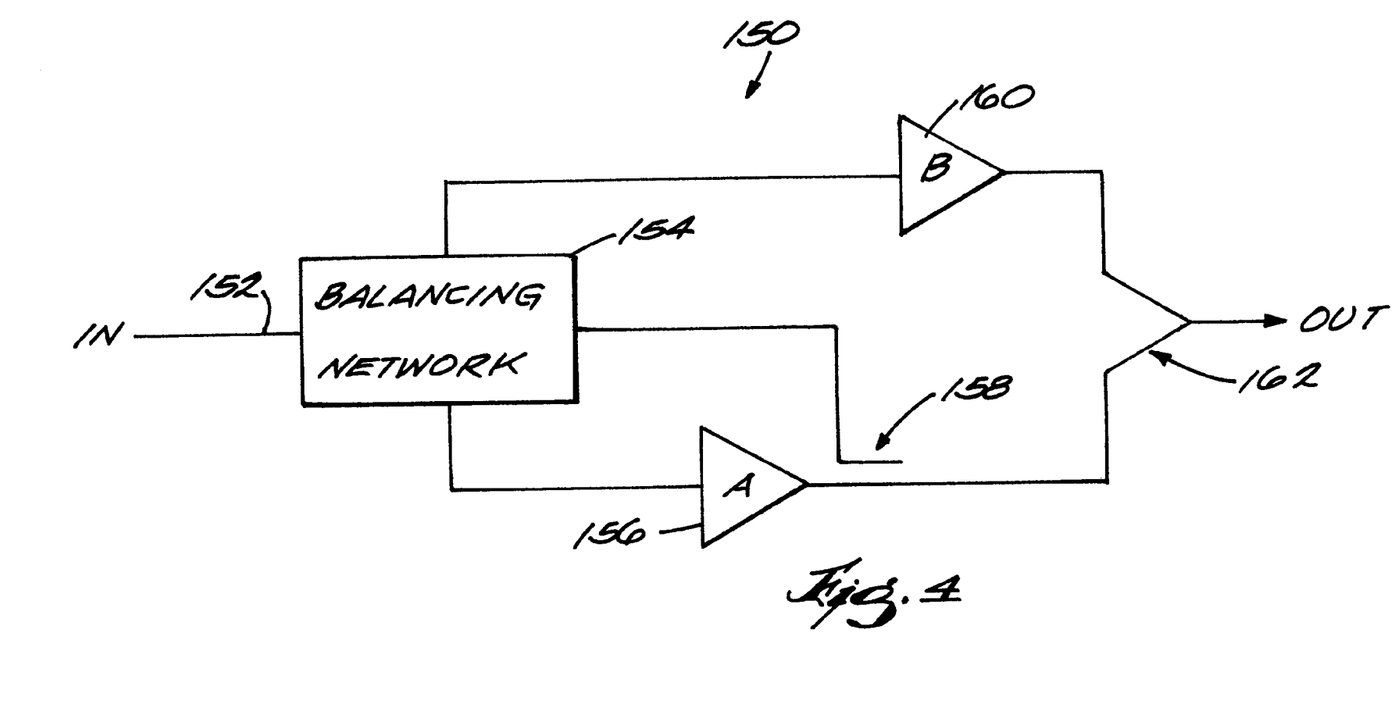
FIG. 4 is a schematic diagram of an OPC amplifier illustrating its signal paths.

FIG. 4 illustrates a more generalized form of an OPC amplifier 150. The amplifier 150 includes an input node 152, a balancing network 154 that provides gain and phase adjustments to various signals propagated through the amplifier 150. The amplifier 150 also includes a main amplifier 156, a sampling coupler 158, an error amplifier 160, and an output combiner 162. As can be appreciated, the gain and phase adjustment components shown specifically in FIGS. 1 and 2 could be implemented, given the teachings of the circuit shown in FIGS. 1 and 2, in different ways. For example, the gain and phase components could be separated and placed in different locations in the circuit. A way of showing this variation possibility is in the balancing network 154.

As can be seen from the above, the present invention provides an amplifier that has higher efficiency than many known amplifiers. Various features and advantages of the invention are set forth in the following claims.

What is claimed is:

1. An amplifier for amplifying a main signal, the amplifier comprising:
    a main amplifier operable to receive the main signal and generate an amplified signal having a main component and an error component;
    a second amplifier coupled in a feed-forward arrangement to the main amplifier and operable to receive an input signal and to generate an output signal having a main component and an error component;
    a balancing network coupled to the main amplifier and to the second amplifier, the balancing network operable to isolate a sample of the error component of the amplified signal, invert the sample, and combine the sample with the input signal to the second amplifier, wherein the balancing network includes at least one gain control component and at least one phase control component; and
    an unequal combiner coupled to the balancing network, the combiner having a coupling ratio that is substantially equal to a power ratio of the signal from the main amplifier and the output signal from the second amplifier, wherein the amplified signal from the main amplifier and the output signal of the second amplifier are combined such that the error components of the amplified signal and the output signal substantially cancel one another and the main components of the amplified signal and the output signal are added to one another.

2. An amplifier as claimed in claim 1, wherein the main amplifier has a gain and the second amplifier has a gain that is substantially the same as the gain of the main amplifier.

3. An amplifier as claimed in claim 1, wherein the unequal combiner has a first input and a second input and about 1.5 dB less coupling from the second input than the first input.

4. An amplifier as claimed in claim 1, wherein the balancing network includes a coupler coupled to the main amplifier.

5. An amplifier as claimed in claim 4, wherein the balancing network includes a delay coupled to the coupler.

6. An error correction amplifier comprising
    an input node,
    a main amplifier coupled to the input node, the main amplifier operable to generate an amplified signal having a main component and an error component;
    a first gain and phase control assembly coupled to the input node;
    a second gain and phase control assembly coupled to the main amplifier;
    a first combiner coupled to the first gain and phase control assembly and to the second gain and phase control assembly;
    a second amplifier coupled to the first combiner; and
    an unbalanced power combiner having a first input coupled to the second amplifier and a second input coupled to the main amplifier, the unbalanced power combiner having a gain proportional to 1/L, where L is representative of a loss from the main amplifier to the second input.

7. An amplifier as claimed in claim 6, wherein the main amplifier has a gain and the second amplifier has a gain that is substantially the same as the gain of the main amplifier.

8. An amplifier as claimed in claim 6, wherein the unbalanced power combiner has a first input node and a second input node and about 1.5 dB less coupling from the second input node than the first input node.

9. An amplifier as claimed in claim 6, further comprising a delay coupled to the first combiner.

10. An amplifier as claimed in claim 9, wherein first combiner and the delay have a gain proportional to 1/L.

11. A method of amplifying a signal, the method comprising:
    dividing an input signal into a first component and a second component;
    amplifying the first component of the input signal to create an output signal;
    sampling the output signal to create a sampled signal;
    adjusting the phase and gain of the sampled signal;
    combining the sampled signal and the second component of the input signal to create a combined signal;
    amplifying the combined signal to create a correction signal; and
    combining the output signal and the correction signal in an unequal combiner to create an amplified signal.

12. A method as claimed in claim 11, wherein the first component of the input signal is amplified by a first gain and the combined signal is amplified by a second gain that is substantially equal to the first gain.

13. A method as claimed in claim 11, further comprising the step of passing the output signal through lossy elements having a gain that is substantially equal to the gain in a branch of the unequal combiner.

14. A method as claimed in claim 13, further comprising generating an amplified signal that is proportional to the square of the gain in the branch of the unequal combiner.

15. A method as claimed in claim 11, wherein the combined signal is amplified to create a relatively high amplitude correction signal.

16. A method as claimed in claim 11, wherein the amplitude of the correction signal is greater than the amplitude of the output signal.

17. A method as claimed in claim 11, further comprising adjusting the phase of the first component.

18. An error correction amplifier for amplifying a main signal, the amplifier comprising:
- an input node;
- a first coupler coupled to the input node;
- a main amplifier coupled to the first coupler and operable to generate an amplified signal having a main component and a noise component;
- a sampling coupler coupled to the main amplifier to divert a part of the amplified signal to a feed-forward path having a gain and phase control mechanism, the sampling coupler having a coefficient proportional to the inverse of the gain of the main amplifier;
- a second gain and phase control mechanism coupled to the first coupler;
- a first combiner to combine the signal from the first and second gain and phase control mechanisms;
- an error amplifier coupled to the first combiner and operable to generate an output signal having a main component and a noise component; and
- an unequal combiner coupled to the error amplifier and the main amplifier, the combiner having a coupling ratio that is substantially equal to a power ratio of the amplified signal from the main amplifier and the output signal from the error amplifier, wherein the amplified signal from the main amplifier and the output signal of the error amplifier are combined such that the error components of the amplified signal and the output signal substantially cancel one another and the main components of the amplified signal and the output signal are added to one another.

* * * * *